United States Patent
Tien et al.

(10) Patent No.: US 8,727,567 B1
(45) Date of Patent: May 20, 2014

(54) SEMICONDUCTOR LIGHT SOURCE HAVING A REFLECTOR

(71) Applicants: An-Chun Tien, San Jose, CA (US); James Yonghong Guo, Union City, CA (US); Vincent V. Wong, Los Altos, CA (US); Jay A. Skidmore, San Jose, CA (US)

(72) Inventors: An-Chun Tien, San Jose, CA (US); James Yonghong Guo, Union City, CA (US); Vincent V. Wong, Los Altos, CA (US); Jay A. Skidmore, San Jose, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 0 days.

(21) Appl. No.: 13/718,971

(22) Filed: Dec. 18, 2012

(51) Int. Cl.
*F21V 29/00* (2006.01)
*F21V 7/00* (2006.01)

(52) U.S. Cl.
USPC ............ 362/235; 362/500; 362/249.02

(58) Field of Classification Search
USPC ........... 362/235, 500, 249.02, 169; 369/109.2
See application file for complete search history.

(56) References Cited

U.S. PATENT DOCUMENTS

| | | | |
|---|---|---|---|
| 4,633,476 A | 12/1986 | Scifres et al. | 372/45.01 |
| 5,389,578 A | 2/1995 | Hodson et al. | 438/25 |
| 6,873,799 B2 * | 3/2005 | Cohen et al. | 398/135 |
| 7,160,972 B2 * | 1/2007 | Young et al. | 528/31 |
| 7,344,902 B2 * | 3/2008 | Basin et al. | 438/27 |
| 7,782,550 B2 | 8/2010 | Vancoille | 359/726 |
| 8,003,998 B2 | 8/2011 | Bogner et al. | 257/98 |
| 2004/0155565 A1 * | 8/2004 | Holder et al. | 313/113 |
| 2006/0093011 A1 | 5/2006 | Vancoille | 372/101 |
| 2006/0164836 A1 * | 7/2006 | Suehiro et al. | 362/294 |
| 2006/0278882 A1 | 12/2006 | Leung et al. | 257/98 |
| 2007/0171673 A1 * | 7/2007 | Song et al. | 362/612 |
| 2010/0213487 A1 * | 8/2010 | Kuo et al. | 257/98 |
| 2011/0001431 A1 | 1/2011 | Brukilacchio | 315/152 |
| 2011/0085343 A1 * | 4/2011 | Ohno et al. | 362/510 |
| 2011/0234941 A1 | 9/2011 | Gourlay | 349/64 |
| 2012/0113621 A1 | 5/2012 | Lee et al. | 362/97.1 |

FOREIGN PATENT DOCUMENTS

| | | | |
|---|---|---|---|
| EP | 1200772 | 12/2007 | F21S 2/00 |
| RU | 2009103911 | 7/2007 | H01L 33/00 |
| WO | 2008003176 | 1/2008 | H01L 33/00 |

* cited by examiner

*Primary Examiner* — Tracie Y Green
(74) *Attorney, Agent, or Firm* — Matthew A. Pequignot; Pequignot + Myers LLC

(57) ABSTRACT

A reflector is mounted to an outer perimeter of a heat sink holding at least one edge-emitting semiconductor chip, for example a laser diode. The reflector has a shape suitable for gathering light emitted by the laser diodes and redirecting the light in an upward direction away from the heat sink. The reflector can be overmolded onto the heat sink. The reflector can operate by total internal reflection, so that no additional reflector coating step is required. Injection molding of the reflectors onto the heat sink holding the laser diodes enables mass production of powerful yet inexpensive laser light sources.

14 Claims, 3 Drawing Sheets

SEMICONDUCTOR LIGHT SOURCE HAVING A REFLECTOR

TECHNICAL FIELD

The present invention relates to light sources, and in particular to semiconductor light sources for producing a directed beam of light suitable, for example, for range imaging.

BACKGROUND OF THE INVENTION

Range imaging is presently finding increasing use in gesture recognition applications. In range imaging, a pulsed light source illuminates an object, and a gated detector array is used to obtain an image of the object. The detector array is equipped with an electronic gate or shutter that makes the detector array responsive to light only during a narrow time window when the "gate" is open. The moment of opening the "gate" is delayed by a delay time with respect to the moment the light pulse is emitted. The emitted light pulse propagates a pre-defined distance corresponding to the delay time, reflects from an object located at that distance, and propagates back. Any light reflected from an object located before or after the pre-defined distance will be suppressed by the gated detector array. The time delay is varied to obtain 3D imagery slice-by-slice.

Another approach to range imaging consists in modulating the illuminating light at a high modulation frequency and detecting, for each pixel of a detector array, a modulation phase delay between the illuminating light and light detected by the pixel. The modulation phase delay in a pixel is proportional to a distance to the object, or more particularly, the distance to a point in the illuminated scenery imaged by the pixel. At least tens of megahertz modulation rates and 10 mW level output optical power are usually required for either type of range imaging.

The modulation speed and optical power requirements make edge-emitting laser diodes preferable light sources for range imaging. Directly modulated edge-emitting laser diode chips, generating hundreds of milliwatts of infrared light, can nowadays be mass produced at a reasonably low cost, however a reliable and efficient packaging of the laser diode chips into Watt-level light sources is still relatively expensive. Powerful laser diode chips require effective removal of heat generated during normal operation. The emitted light needs to be gathered with low optical loss, reshaped for optimal illumination of an object being imaged, and directed to the object. The edge-emitting geometry of the laser diode chips, which are usually mounted on a common flat heat sink, frequently requires a complex and costly combination of high-quality turning micromirrors to direct beams emitted by individual laser chips towards the imaged object.

To incorporate a range imaging system into a gesture recognition system, for example in a gaming and/or a mobile phone application, manufacturing costs need to be dropped considerably to make the range imaging system affordable by a mass consumer. At the same time, there is a strong market pressure to miniaturize the componentry for portable consumer devices. This necessitates miniaturization of range imaging light sources, while simultaneously dropping the manufacturing costs of these light sources.

Scifres et al. in U.S. Pat. No. 4,633,476 disclose a laser diode that can emit light perpendicular to the plane of the laser chip, allowing light from multiple lasers on a common heat sink to be combined into a single, more powerful beam. Referring to FIG. 1, a laser diode 10 includes an active layer 11 sandwiched between p- and n-layers 12 and 13, respectively. The n-layer 13 includes two sub-layers, 13A and 13B. A V-shaped groove 14 is etched into the p-layer 12 and the second n-sublayer 13B from the p-layer 12 side. P- and n-electrodes 15 and 16 contact the p- and n-layers 12 and 13, respectively. The p-electrode 15 can be made sufficiently thick to serve as a heat sink. Gaps 17 are cut into the p- and n-layers 12 and 13 and into the active layer 11, to function as laser cavity mirrors. In operation, an electric current is applied between the p- and n-electrodes 15 and 16, respectively, and generated light 18 is reflected from inside the faces of the grooves 14, exiting through cut-outs 19 in the n-electrodes 16.

Among advantages of the laser diode of Scifres et al. are low profile (height) and a possibility to combine light from multiple laser diode chips. Detrimentally, however, the light source of Scifres et al. is rather difficult to manufacture. Multiple grooves and gaps need to be etched or cut into the semiconductor chip across the active layer 11, reducing yield, potentially impacting reliability, and increasing manufacturing costs.

The prior art is lacking an edge-emitting laser diode light source suitable for a range imaging system that would be inexpensive, compact, and reliable, while allowing light from many individual laser diode chips be easily combined to form a single powerful laser beam. Accordingly, it is an object of the present invention to overcome the shortcomings of the prior art by providing an edge-emitting semiconductor light source suitable for a range imaging system.

SUMMARY OF THE INVENTION

In accordance with the invention, there is provided a method of manufacturing a light source, comprising:

(a) providing a heat sink and a first semiconductor chip having an edge for emitting light;

(b) mounting the first semiconductor chip flat on the heat sink proximate the outer perimeter of the heat sink, the edge facing outwards;

(c) mounting a reflector to an outer perimeter of the heat sink, the reflector comprising a reflecting surface for redirecting light emitted from the edge to propagate substantially perpendicular to the first semiconductor chip; and (d) optically coupling the reflector to the edge of the first semiconductor chip.

In accordance with another aspect of the invention, there is further provided a light source comprising:

a heat sink;

a first semiconductor chip having an edge for emitting light, wherein the first semiconductor chip is disposed flat on the heat sink proximate the outer perimeter thereof, the edge facing outwards; and a reflector affixed to an outer perimeter of the heat sink and optically coupled to the edge of the first semiconductor chip, the reflector comprising a reflecting surface for redirecting light emitted from the edge to propagate substantially perpendicular to the first semiconductor chip.

In a preferred embodiment of the invention, a plastic reflector is overmolded onto a round flat heat sink supporting multiple laser diode chips laying flat on the heat sink, emitting edges facing outwards and towards the plastic reflector. The reflector can be manufactured cheaply using injection molding or overmolding directly onto the heat sink. The overmolded reflector can encapsulate the laser diode chips for environmental protection. The reflector has a shape suitable for light gathering from the laser diode chips and redirecting the light in an upward direction away from the heat sink, approximately perpendicular to the heat sink. Preferably, the reflector operates by total internal reflection, such that no additional reflector coating step is required. This solution allows very simple, inexpensive, yet fast and powerful light sources for range imaging to be mass produced at low cost.

BRIEF DESCRIPTION OF THE DRAWINGS

Exemplary embodiments will now be described in conjunction with the drawings, in which.

DETAILED DESCRIPTION OF THE INVENTION

While the present teachings are described in conjunction with various embodiments and examples, it is not intended that the present teachings be limited to such embodiments. On the contrary, the present teachings encompass various alternatives, modifications and equivalents, as will be appreciated by those of skill in the art.

Figure 1:
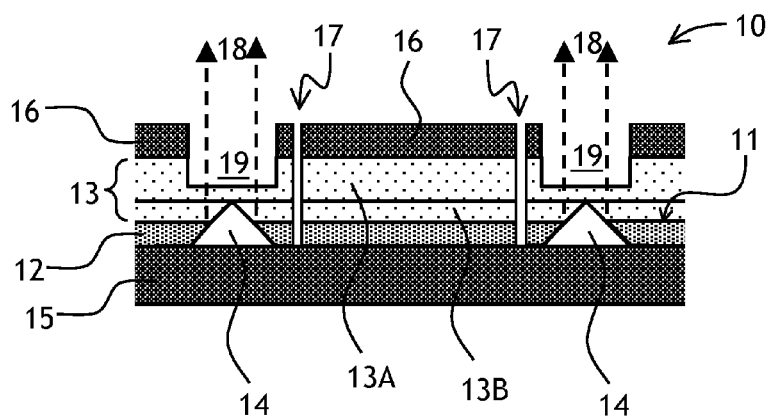
FIG. 1 is a side cross-sectional view of a prior-art light source.
Figure 2A:
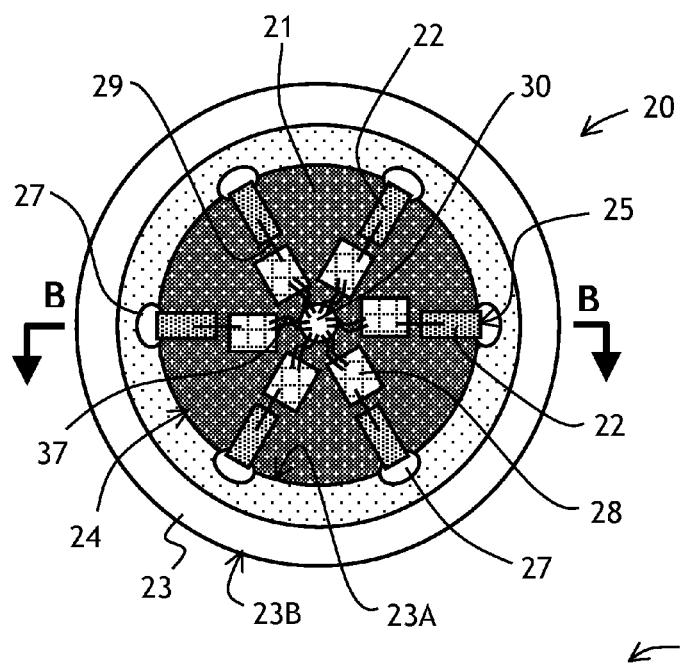
FIG. 2A is a plan view of a light source of the invention.
Figure 2B:
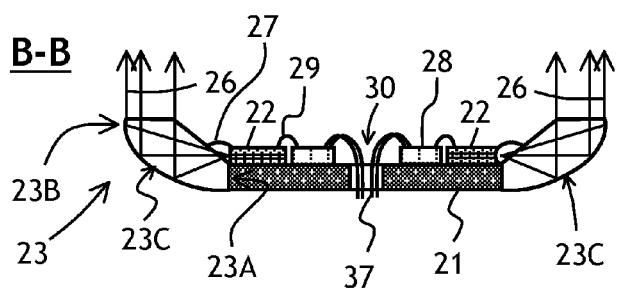
FIG. 2B is a side cross-sectional view of FIG. 2A taken along lines B-B.

Referring to FIGS. 2A and 2B, a light source 20 of the invention includes a flat heat sink 21 and six edge-emitting laser diode chips 22 disposed flat on the heat sink 21. A reflector 23 is affixed to an outer perimeter 24 of the heat sink 21 and optically coupled to emitting edges 25 of the laser diode chips 22, for redirecting light 26 emitted from the emitting edges 25 to propagate substantially perpendicular to the semiconductor chips 22. Herein, the term "substantially perpendicular" includes propagation of light away from the plane of the heat sink 21 and/or the plane of the laser diode chips 22, and thus can include directions of propagation that are not geometrically perpendicular to the semiconductor chips 22, as long as the light 26 emitted by the edge-emitting laser diode chips 22 can be gathered in a single direction, for example the vertical direction, as seen in FIG. 2B, for illuminating an object disposed out of plane of the heat sink 21 and/or the laser diode chips 22.

The semiconductor chips 22 are disposed proximate the outer perimeter 24 of the heat sink 21, the emitting edges 25 facing outwards. In the embodiment shown, the heat sink 21 has a round shape, and the reflector 23 is preferably injection-molded out of a thermoplastic material into a ring shape having inner and outer perimeters 23A and 23B, respectively, and a concave reflecting surface 23C extending therebetween for reflecting the light 26. The inner perimeter 23A of the reflector 23 matches the outer perimeter 24 of the heat sink 21. The reflector 23 is mounted, preferably overmolded, along its inner perimeter 23A to the outer perimeter 24 of the heat sink 21. The laser chips 22 are mounted in equiangular increments of 60 degrees, although other mounting geometries are of course possible. Drops of an index-matching gel 27 are placed between the emitting edges 25 of the laser diode chips 22, on one hand, and the reflector 23, on the other, for optical coupling therebetween. As is known to a person skilled in the art, the refractive index of the index-matching gel is selected to be between the refractive indices of the semiconductor chips 22 and the reflector 23. The closer the matching of the refractive indices is, the smaller the reflective loss at the interface between the emitting edges 25 and the reflector 23. An optional coating, not shown, of the laser emitting edge 25, would need to be modified to optimize the laser power performance, because the reflectivity at the emitting edge 15 is impacted by a surrounding medium, in this case the index-matching gel 27. Driver circuits 28 for driving the laser diode chips 22, connected to the laser diode chips 22 via wirebonds 29, can be conveniently disposed on the heat sink 21, as best seen in FIG. 2A. Wires 37 from the driver circuits 28 can be conveniently fed through an opening 30 in the center of the heat sink 21.

In a preferred embodiment, the reflector 23 is configured for total internal reflection (TIR) of the emitted light 26. To meet the condition for TIR, the angle of incidence of the light 26 emitted from the laser diode chips 22 needs to be greater than arcsin(1/n), where n is the relative index of refraction of the optical material making up the reflector 23 relative to the surrounding medium, in most cases air. In practical terms, that means that the index of refraction n of the reflector 23 needs to be sufficiently high for the TIR of the emitted light 26 to occur. In practice, index of refraction of 1.45 or higher is sufficient for most cases.

For any light ray meeting the TIR condition, the reflectivity is 100%, as compared to about 80% reflectivity of a typical metallic reflective overcoating of a plastic. Thus, TIR can considerably improve the light throughput of the reflector 23. Furthermore, the optical damage threshold of an uncoated optical material is generally much higher than of its coated counterpart.

For a given optical material and a given direction of reflection, shape of the reflecting surface 23C of the reflector 23 can be optimized for capturing most of the laser beam 26 of the laser diode chips 22 and directing the beam 26 towards the target. For example, when the index of refraction is 1.55, and the reflection is strictly perpendicular to the plane of the laser diode chips 22, rays within ±24.6° from the chief ray meet the total internal reflection condition in an ellipsoid with a 0.707 major axis to minor axis ratio when the light source is placed at one of the foci of the ellipsoid. This angular range covers most of the beam divergence of the laser diode chips 22, capturing at least 99% of the emitted optical power at full width at half maximum (FWHM) of 18 degrees. In practice, capturing at least 90% of light can be targeted.

Figure 3:
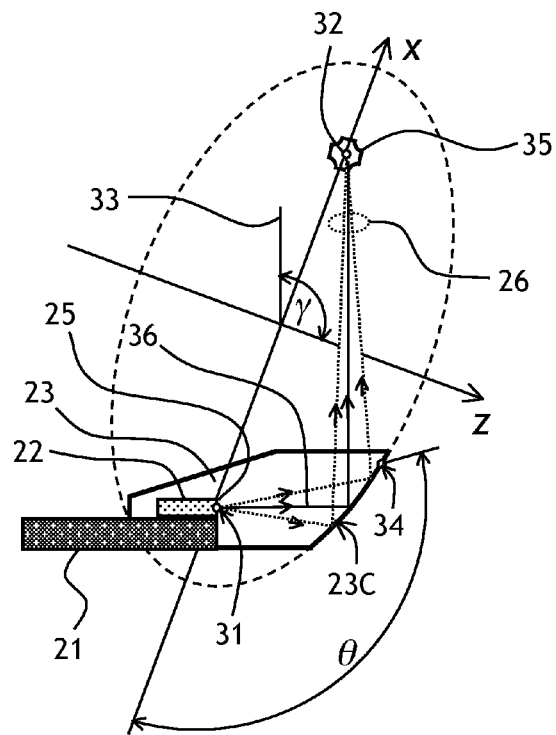
FIG. 3 is a side cross-sectional view of a reflector used in the light source of FIGS. 2A and 2B, showing coordinates used to define the shape of its reflective surface.

Table 1 below summarizes various possible types of the reflective surface 23C and achievable divergence ranges meeting the TIR condition. FIG. 3 illustrates the coordinates x, z, γ, and θ used to define the reflective surface 23C. In FIG. 3, x is a lateral coordinate connecting foci 31, 32 of the reflective surface 23C; z is a linear coordinate perpendicular to x; γ is an angle of tilt of the x, z coordinate system relative to a perpendicular 33 to the semiconductor chip 22; and θ is a polar angle measured from the x axis to a point 34 of the reflective surface 23C. The emitting edge 25 is placed at the first focus 31, and an object to be illuminated 35 is placed at the second focus 32. A chief ray 36 is reflected at 45 degrees, turning by 90 degrees upon reflecting from the reflecting surface 23C, although other reflection angles can be used. The tilt angle γ is selected according to a preferred angle of illumination of the object 35. For the ellipsoidal surface presented in Table 1, the tilt angle γ is 135 degrees. The refractive index n of the reflector 23 is 1.55.

TABLE 1

| Shape of the reflective surface 23C. | Location of the emitting edges 25 | Angular range from chief ray 36 for total internal reflection | Beam characteristics after the reflector |
|---|---|---|---|
| Flat | anywhere | +90° to −4.8° | Diverging. The virtual point source is the image of the emitting edge 25 of the laser diode chip 22. |
| Parabolic | Focal point | +90° to −19.6° | Collimated. |
| Ellipsoidal $(x/a)^2 + (z/b)^2 = 1$ | Focal point | +24.6° to −24.6° $\left(b = \dfrac{a}{\sqrt{2}}\right)$ | Converging to another focal point, then diverging. |
| Hyperbolic $(x/a)^2 − (z/b)^2 = 1$ | Focal point | +90° to −9.3° (b = 0.3a) | Diverging; the virtual source is at another (second) focal point. |
| logarithmic spiral $x = e^\theta$ | Origin of the spiral | All. | Diverging; some rays can hit the reflective surface 23C. more than once; for this surface type, the x coordinate has the origin at the emitting edge 25. |

In FIG. 3, the reflector 23 is completely overmolded over the semiconductor chips 22 for environmental protection of the latter. When the semiconductor chips 22 are overmolded with the reflector 23, drops of the index matching gel 27 is not required. Alternatively, a thermoplastic material can be overmolded over the semiconductor chips 22 to optically couple the emitting edges 25 of the semiconductor chips 22 to the pre-installed reflector 23, and to encapsulate the semiconductor chips 22 for environmental protection of the latter.

Other types of the reflecting surface 23C are possible, including non-rotationally-symmetric surfaces, ellipsoidal/hyperbolic or otherwise, and/or convex surfaces for better spreading of the illuminating light 26. The number of the laser diode chips 22 can vary from a single chip 22 to three or more chips 22 and even sixteen or more chips 22. The maximum number of semiconductor chips 22 can be estimated from the formula Max. Number of Chips=135°/(Full Width at Half Maximum of beam divergence in a lateral direction) (1)

More semiconductor chips 22 can be disposed on the heat sink 21, but the outer portion of the light beam 26 from each semiconductor chip 22 would hit the surface 23C that is optimized for an adjacent semiconductor chip 22. In other words, only the inner portions of the beams 26 would be optimally reflected.

Furthermore, not only laser diode chips 22, but in principle, other semiconductor chips 22 capable of emitting light, such as light emitting diodes, can be used as well. The semiconductor chips 22 can be positioned anywhere proximate the outer perimeter 24 of the heat sink 21, as long as the light 26 can be coupled to the reflector 23 mounted to the outer perimeter 24 of the heat sink 21. A reflector coating, not shown, can be used on the reflecting surface 23C, although TIR reflecting surface 23C is preferable for cost, power handling, and optical throughput reasons.

Figure 4:
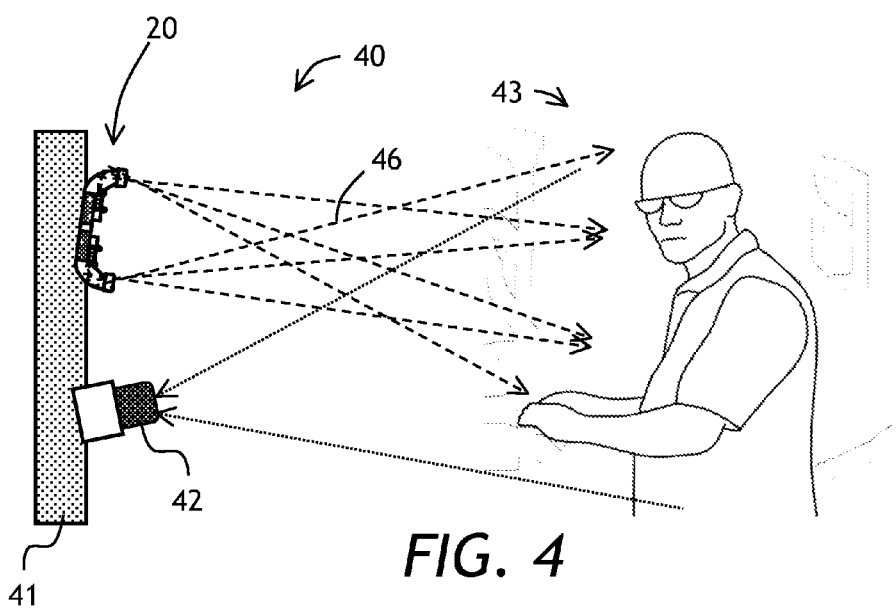
FIG. 4 is a side cross-sectional view of a range imaging system of the invention.

Turning now to FIG. 4, a range imaging system 40 of the invention includes the light source 20 mounted on a base 41, and a camera 42 mounted to the base 41 proximate the light source 20. The base 41 can include, or be mounted on, a computer display, a television set cover, a cell phone cover, etc. In operation, the light source 20 emits pulsed or modulated light 46 to illuminate an object, for example a user 43. The camera 42 obtains three-dimensional images of the user 43, which are then processed by a gesture recognition system, not shown, to determine gestures of the user 43 in real time.

Figure 5:
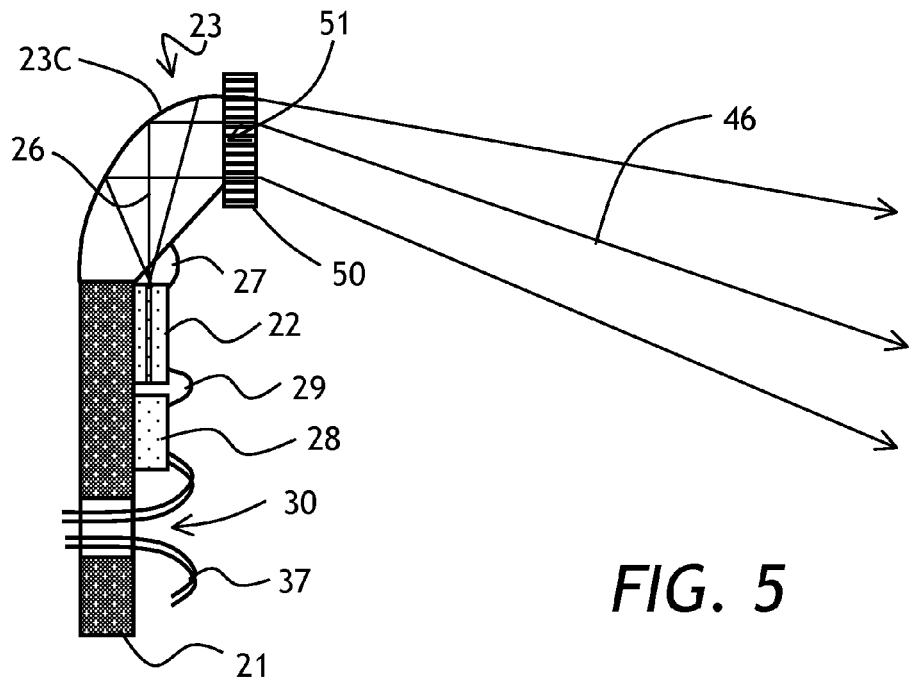
FIG. 5 is a magnified cross-sectional view of FIG. 3 showing a diffractive optical element mounted on the reflector.

Additional optics can be used to reshape and direct the pulsed or modulated light 46 towards the user 43. Referring now to FIG. 5, a diffractive optic 50 is disposed on an outer surface 51 of the reflector 23 for redirecting the beams 46. Alternatively, the outer surface 51 can be concave, convex, etc., or include a refractive and/or a diffractive element for modifying the angular distribution of the beams 46 to propagate substantially perpendicular to the semiconductor chips 22, or to create an angular distribution of the light beams 46, appropriate for the illumination task at hand. The refractive surface can include a Fresnel refractive surface, a binary diffractive pattern, and the like. The optic 50 allows one to select the shape of the reflecting surface 23C that captures the emitted light 26 most efficiently through TIR, and then to select the optic 50 to redirect the beams 46 onto a target in a most efficient manner, thus decoupling the TIR and the target illumination requirements from each other.

Figure 6:
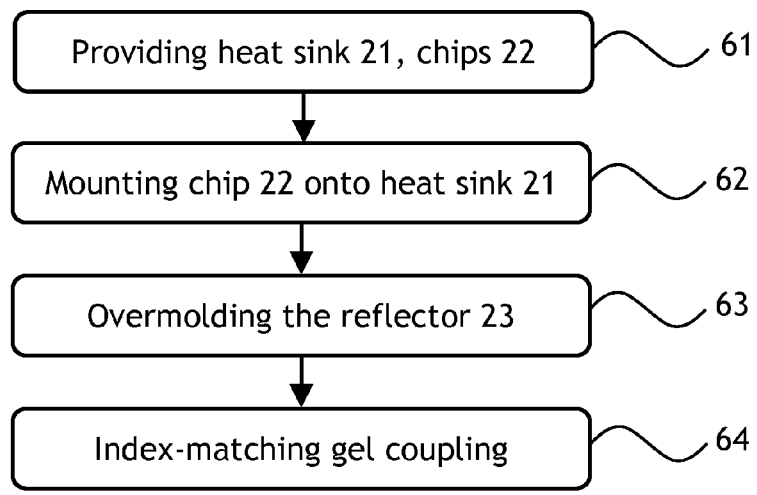
FIG. 6 is a block diagram of a method of manufacturing the light source of FIGS. 2A and 2B.

Turning to FIG. 6, a method 60 of manufacturing the light source 20 includes a step 61 of providing the heat sink 21 and at least one of the laser diode chips 22. In a step 62, the semiconductor chip 22 is mounted flat on the heat sink. In a step 63, the reflector 23 is mounted, for example molded or overmolded, to the outer perimeter 24 of the heat sink 21. Finally, in a step 64, the reflector 23 is optically coupled to the edge 25 of the semiconductor chip 22, preferably using the index matching gel 27 or another index-matching material. The laser diode chip 22 is preferably mounted proximate the outer perimeter 24 of the heat sink 21, for example flash with the outer perimeter 24, the emitting edge 25 facing outwards, towards to the reflector 23. The reflector 23 is preferably injection molded out of a thermoplastic material, as is well known to a person skilled in the art. In one embodiment, the reflector 23 is injection-molded or overmolded directly to the heat sink 21 in step 63. In one embodiment, the reflector 23 is overmolded over the semiconductor chips 22, thus uniting the two last steps 63 and 64 into a single step. Alternatively, the reflector 23 can be pre-installed, and an additional thermoplastic can be overmolded between the reflector 23 and the semiconductor chips 22, preferably to completely encapsulate the semiconductor chips 22 for the environmental protection of the latter. Although a reflector coating, not shown, can be applied to the reflecting surface 23C of the reflector 23, it is preferable that the molded reflector 23 have an index of refraction sufficiently high for the TIR of the emitted light 26 by the uncoated reflecting surface 23C. In this way, the reflector 23 can be inexpensively mass produced in a single injection molding operation.

Although the heat sink 21 can have many different shapes, a round shape is generally preferable; for the round heat sink 21, the reflector 23 can be injection molded into a ring shape having the inner 23A and outer 23B perimeters, the reflecting surface 23C extending therebetween, as shown in FIGS. 2A, 2B, FIG. 3, and FIG. 5. For round reflectors 23, a plurality of the laser diode chips 22 can be disposed, for example, three, six, twelve laser diode chips 22, etc., preferably in equiangular increments to save space, around the outer perimeter 24 of the heat sink 21, and optically coupled to the same reflector 23.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of manufacturing a light source, comprising:
   (a) providing a heat sink having an outer perimeter, and a plurality of semiconductor chips each having a first edge for emitting light;
   (b) mounting the plurality of semiconductor chips flat on the heat sink proximate the outer perimeter of the heat sink, the first edges of the plurality of semiconductor chips facing outwards;
   (c) injection molding a reflector out of a thermoplastic material, the reflector comprising a reflecting surface;
   (d) mounting the reflector to the outer perimeter of the heat sink so that the reflecting surface is disposed for redirecting light emitted from the first edges to propagate substantially perpendicular to the plurality of semiconductor chips, wherein step (c) is performed before, or simultaneously with, step (d); and
   (e) optically coupling the reflector to the first edges of the plurality of semiconductor chips.

2. The method of claim 1, wherein step (d) includes overmolding the reflector made in step (c) to the heat sink.

3. The method of claim 1, wherein step (e) includes overmolding an index matching material over the plurality of semiconductor chips, for optically coupling the reflector to the first edges of the plurality of semiconductor chips, and for environmental protection of the plurality of semiconductor chips.

4. The method of claim 1, wherein in step (d), the molded reflector has an index of refraction sufficiently high for total internal reflection of the emitted light.

5. The method of claim 4, wherein the heat sink has a round shape, and the reflector has a ring shape having inner and outer perimeters, the reflecting surface extending therebetween, wherein the inner perimeter of the reflector matches the outer perimeter of the heat sink;
   wherein in step (d), the reflector is mounted along the inner perimeter thereof to the outer perimeter of the heat sink.

6. The method of claim 5, wherein in step (e), the reflector is optically coupled to the first edge of each of the semiconductor chips by placing an optical index-matching material between each first edge and the reflector.

7. A light source comprising:
   a round heat sink having an outer perimeter;
   a plurality of laser diode chips each having a first edge for emitting light, wherein each laser diode chip is disposed flat on the heat sink proximate the outer perimeter thereof, the first edges of the plurality of laser diode chips facing outwards; and
   a ring-shaped reflector having inner and outer perimeters and a reflecting surface extending therebetween, the inner perimeter matching the outer perimeter of the heat sink, wherein the ring-shaped reflector is affixed along the inner perimeter thereof to the outer perimeter of the heat sink and optically coupled to the first edges of plurality of laser diode chips so that the reflecting surface is disposed for redirecting light emitted from the first edges to propagate substantially perpendicular to the plurality of laser diode chips,
   wherein the reflector comprises a material having a refractive index of 1.45 or higher, for total internal reflection of the emitted light at the reflecting surface.

8. The light source of claim 7, wherein the plurality of laser diode chips includes at least three laser diode chips.

9. The light source of claim 7, wherein the reflector comprises an injection-moldable thermoplastic material.

10. The light source of claim 7, wherein the reflecting surface comprises a concave surface selected from the group consisting of conical, ellipsoidal, hyperbolic, and logarithmic spiral surface.

11. The light source of claim 10, wherein the plurality of laser diode chips are disposed in equiangular increments.

12. The light source of claim 10, wherein the reflector comprises a refractive and/or a diffractive element or surface for modifying an angular distribution of the light emitted by the plurality of the semiconductor chips.

13. The light source of claim 10, further comprising an index matching material disposed between the emitting edges of the plurality of laser diode chips and the reflector, for optical coupling therebetween.

14. The light source of claim 13, wherein the index matching material comprises a thermoplastic material, wherein the thermoplastic material encapsulates the laser diode chips.

* * * * *